United States Patent [19]

Takezawa et al.

[11] Patent Number: 4,625,333
[45] Date of Patent: Nov. 25, 1986

[54] DUPLEX OPTICAL COMMUNICATION DEVICE

[75] Inventors: Hatsuo Takezawa, Yokohama; Satoshi Takebe, Tokyo, both of Japan

[73] Assignee: Tokyo Shibaura Denki Kabushiki Kaisha, Kawasaki, Japan

[21] Appl. No.: 755,980

[22] Filed: Jul. 18, 1985

Related U.S. Application Data

[63] Continuation of Ser. No. 545,007, Oct. 24, 1983, abandoned.

[30] Foreign Application Priority Data

Oct. 26, 1982 [JP] Japan .................. 57-186688

[51] Int. Cl.⁴ .................................................. H04B 9/00
[52] U.S. Cl. .................................. 455/612; 350/96.18; 350/96.20
[58] Field of Search .................. 350/96.18, 96.20; 250/227; 455/612, 610, 618, 619, 606, 607

[56] References Cited

U.S. PATENT DOCUMENTS 4,307,934 12/1981 Palmer ........................ 350/96.18
4,386,268 5/1983 Kock ............................. 250/227
4,427,879 1/1984 Becher et al. .................. 250/227

*Primary Examiner*—Joseph A. Orsino, Jr.
*Attorney, Agent, or Firm*—Cushman, Darby & Cushman

[57] ABSTRACT

A duplex optical communication device is disclosed which includes a transmission module unit having a light emitting element and a lens confronting the light emitting element, a reception module unit having a light receiving element and a lens confronting the light receiving element, and a transmission optical fiber and reception optical fiber, which fibers are so disposed as to confront the light emitting element and the light receiving element, with the lenses, being interposed therebetween. In this device, the distance from the end face of the transmission optical fiber confronting the light emitting element to the lens of the transmission module unit is substantially equal to the imaging length given as the focal length of the lens of the transmission module unit, and the distance between the light emitting surface of the light emitting element and the lens in the transmission module unit. The distance between the end face of the transmission optical fiber confronting the light receiving element and the lens in the reception module unit is substantially equal to or less than the focal length of the lens in the reception module unit.

10 Claims, 10 Drawing Figures

DUPLEX OPTICAL COMMUNICATION DEVICE

This is a continuation of application Ser. No. 545,007, filed Oct. 24, 1983, which was abandoned upon the filing hereof.

BACKGROUND OF THE INVENTION

The present invention relates to a duplex or bidirectional optical communication device.

Figure 1:
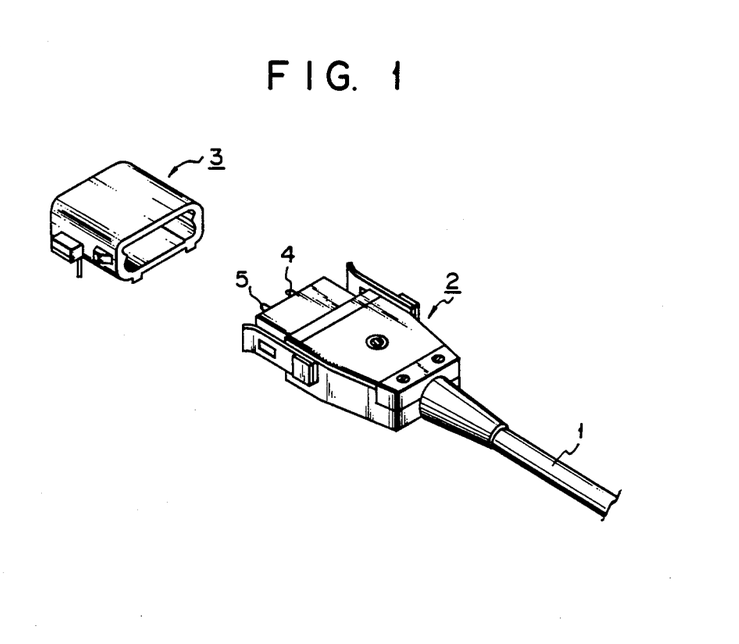
FIG. 1 shows a perspective view of an ordinary duplex optical communication device.

FIG. 1 schematically illustrates a duplex optical communication device. The duplex optical communication device is comprised of a connector plug 2 including a couple of optical fibers for reception and transmission (not shown), an optical fiber cable 1 being extended from the connecting plug 2; a light transmission module unit; a light reception module unit (not shown); and a connector receptacle 3 for receiving the connector plug 2. The transmission optical fiber and the reception optical fiber (not shown) are respectively held in place by metal ferrules 4 and 5. When the connector plug 2 is fitted into the connector receptacle 3, the end faces of the transmission and reception optical fibers face a light emitting element (not shown) in the transmission module unit and a light receiving element (not shown) in the reception module unit, respectively. In such a duplex optical communication device, the rays of light emitted from the light emitting element in the transmission module unit are received at the end face of the transmission optical fiber and are transmitted through the transmission optical fiber. The rays transmitted through the transmission optical fiber are received by the light receiving element in the reception module unit, through the end face of the transmission optical fiber.

Figure 2:
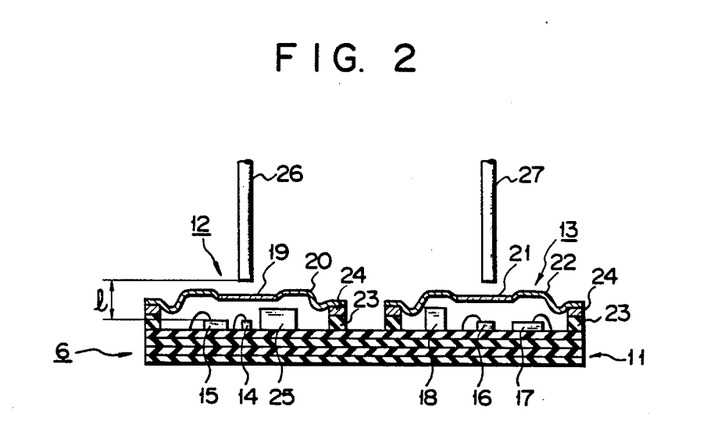
FIG. 2 shows a cross-sectional view of a conventional duplex optical communication device.

In FIG. 2, only a module device 6, a transmission optical fiber 26 and a reception optical fiber 27 are illustrated, for the sake or simplicity.

In the figure, a transmission module unit 12 and a reception module unit 13 are both provided on a multilayered interconnection ceramic substrate 11. The transmission module unit 12 contains a light emitting element 14, a driver integrated circuit 15 for driving the light emitting element 14, and a resistive element 25, which are formed on the ceramic substrate 11. The reception module unit 13 is comprised of a PIN-PD (photo diodide) 16, a receiver integrated circuit 17 for amplifying the PIN-PD 16, and a by-pass capacitor 18, which are also formed on the ceramic substrate 11. The transmission module unit 12 is further provided with a shell 20 made of Kovar to be used in covering the light emitting element 14, the driver integrated circuit 15 and the resistive element 25. Similarly, the reception module unit 13 is provided with a shell 22 made of Kovar to be used in covering the PIN-PD 16, the receiver integrated circuit 17 and the by-pass capacitor 18. A transparent window member 19, such as a glass plate is provided at the portion of the shell 20 facing the light emitting element 14. Likewise, a transparent window member 21, such as a glass plate is provided at the portion of the shell 22 facing the PIN-PD 16. The shells 20 and 22 are seam-welded to a seal ring 24 provided on a ring-like ceramic member 23. With this welding, the transmission module unit 12 and the reception module unit 13 are hermetically sealed. Disposed above the transparent window member 19 in the transmission module unit 12 is a transmission optical fiber 26 of which the light receiving end face confronts with the light emitting element 14. Similarly, disposed above the transparent window member 21 in the reception module unit 13 is a reception optical fiber 27 of which the light emitting end face faces the PIN-PD 16. The optical fibers 26, 27 are each provided with a core forming a light transmission path and a cladding surrounding the core.

In the duplex optical communication device with such a structure, the rays of light emitted from the light emitting element 14 in the transmission module unit 12 travel at a fixed radiating angle, pass through the transparent window member 19, and come to be incident on the light receiving end face of the transmission optical fiber 26. In this way, the rays from the light emitting element 14 are optically coupled with the transmission optical fiber 26. The rate of the total amount of light emitted from the light emitting element 14 and the amount of light transmitted through the transmission optical fiber 26 is referred to as the optical coupling efficiency $\eta_E$. One of the factors to determine the light coupling efficiency $\eta_E$ of the reception module unit is a distance l between the light emitting surface of the light emitting element 14 and the light receiving end face of the transmission optical fiber 26, and the distance l is mathmetically related with the light coupling efficiency $\eta_E$ by the following equation $$\eta_E \propto \frac{1}{l^2} \quad (A)$$

As may be seen from the formula (A), to improve the light coupling efficiency $\eta_E$, the distance l between the light emitting surface of the light emitting element 14 and the light receiving end face of the transmission optical fiber 26 must be minimized. Actually, there is a limit in shortening the distance between the light receiving surface of the light emitting element 14 and the light receiving end face of the transmission optical fiber 26. The reason for this is that the duplex optical communication device involves some inherent problems with structural features, such as with loop of the bonding wire attached to the light emitting element 14, the thickness of the resistive element 25 and the thickness of the transparent window member 19. The shortest possible distance l attainable is 0.7 mm–1.0 mm, at most. For example, for the light emitting surface of the light emitting element of 0.3 mm×0.3 mm and the transmission optical fiber 26 having a core of 0.5 mm $\phi$ and 0.4 of numeral aperture, the light coupling efficiency $\eta_E$ is approximately 5%.

Another factor to be considered in determining the light coupling efficiency $\eta_E$ is the radiation angle $\theta_E$. The relationship of the radiation angle $\theta_E$ to the light coupling efficiency $\eta_E$ is given by relationship (B), as follows:

$$\eta_E \propto \frac{1}{\tan^2 \theta_E} \quad (B)$$

Relationship (B) indicates that, in improving the light coupling efficiency $\eta_E$, the radiation angle $\theta_E$ must be minimized.

The optical fiber allows only the light rays having an incident angle within a maximum light receiving angle $\theta_{Fmax}$ ($=\sin^{-1} NA$), as given by the numeral aperture NA, to pass therethrough. Therefore, it is essential to make the radiation angle $\theta_E$ small, to increase the light coupling efficiency $\theta_E$; $\theta_{Fmax}$ ($=\sin^{-1} NA$) $\geq \theta_{Emax}$.

A conventional structure capable of decreasing the radiation angle $\theta_E$ may now be described with reference to FIG. 3. In the figure, a transmission module unit 40 has a light emitting element 33 formed on a metal header 31 with a copper plate 34 interposed therebetween. A ball glass or lens 32 is placed on the light emitting element 33. Three lead pins 35–37 are coupled with the metal header 31. The lead pin 36 is electrically connected to the copper plate 34. The lead pin 37 passes through the metal header 31 to connect to the light emitting element 33 through a bonding wire 38. The lead pin 35 is connected to nothing, that is, a dead pin. A metal shell 39 is mounted on the metal header 31 to hermetically seal the components on the metal header 31. A plate glass window 41 is set at that portion of the metal header 31 which confronts the light emitting element 33. With such a structure, the rays of light emitted from the light emitting element 33 enter the ball glass 32, where they are inclined toward each other in such a way as to decrease the radiation angle $\theta_E$. Then, the rays are incident on the light receiving surface of the optical fiber 42, through the plate glass window 41.

Figure 3:
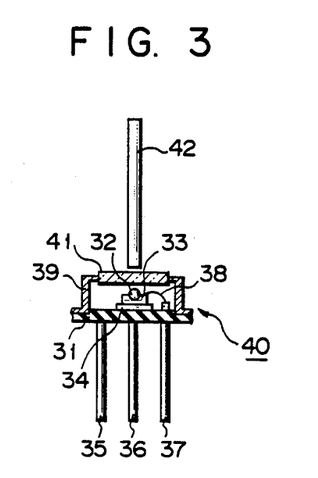
FIG. 3 shows a cross-sectional view of a conventional transmission module unit.

The transmission module unit 40 with the structure shown in FIG. 3 needs the ball glass 32 fixed to the light receiving surface of the light emitting element 33, and is therefore costly to manufacture. This structure can indeed increase the light coupling efficiency $\eta_E$ in the transmission module unit 40, but can little increase that $\eta_D$ in the reception module unit when the ball glass 32 is fixed to the light receiving element PIN-PD. A total light coupling efficiency $\eta_T$ meaning a rate of the rays of light emitted from the transmission module unit to the rays reaching the reception module unit through the optical fiber, is given by $$\eta_T = (\eta_E) \times (\eta_D) \qquad (C)$$

As may be seen from the above equation, in increasing the total light coupling efficiency $\eta_T$, it is necessary to increase both the light coupling efficiencies $\eta_E$, $\eta_D$ on the transmission and reception sides. In this respect, the structure shown in FIG. 3 is not preferable in increasing the total light coupling efficiency $\eta_T$.

Figure 4:
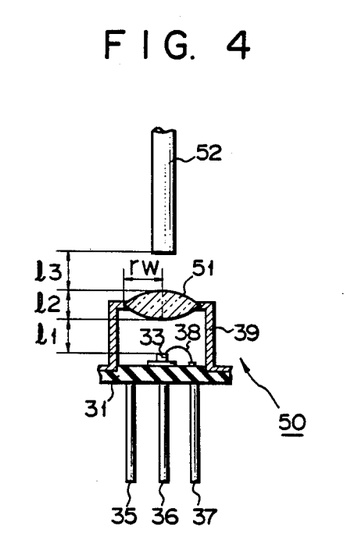
FIG. 4 shows a cross-sectional view of another conventional transmission module unit.

A structure capable of increasing the light coupling efficiency and applicable on both the transmission and reception module units may now be described with reference to FIG. 4. For ease of explanation, the structure shown in FIG. 4 is applied for only the transmission module unit. In the transmission module unit 50 shown in FIG. 4, like reference numerals are applied to like or equivalent portions in FIG. 3, and the explanation of those portions will be omitted. The structure of FIG. 4 does not use the ball glass 32 and uses a convex lens 51 in place of the plate glass window 41. The rays emitted from the light emitting element 33 are collected by the convex lens 51 and incident on the light receiving end face of the optical fiber 52. The presence of the convex lens 51 improves the light coupling efficiency $\eta_E$ on the transmission side by the light collecting function of the lens. When the structure is applied to the reception module unit, the rays coming from the light emitting surface of the optical fiber are collected by the convex lens and applied to the light receiving element PIN-PD. The light collecting action by the convex lens improves the light coupling efficiency $\eta_D$ on the reception side. Thus, when the structure under discussion is applied to both the transmission and reception module unit, the total light coupling efficiency $\eta_T$ is improved with the light collecting action of both of the lens. Further, since the ball glass 32 is not used, the cost to manufacture is reduced.

Figure 5:
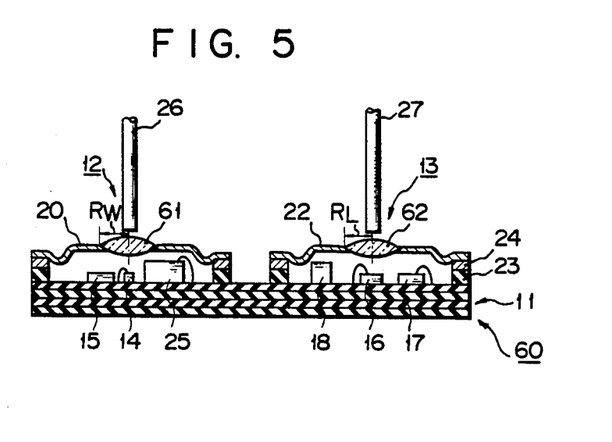
FIG. 5 shows a cross-sectional view of a duplex optical communication device to which the concept of the structure of FIG. 4 is applied for the transmission and reception module units.

FIG. 5 shows a duplex optical communication device in which the structure shown in FIG. 4 is applied to both transmission and reception module units. The duplex optical communication device 60 of FIG. 5 has the same structure as the duplex optical communication device of FIG. 2, except that the transparent window members 19 and 21 are replaced by convex lenses 61 and 62, respectively. The total light coupling efficiency $\eta_T$ of the duplex optical communication devices of FIG. 5 and FIG. 2 were measured. The results of measurement showed that a difference in the total light coupling efficiency $\eta_T$ between these optical communication devices is indistinctive and is smaller than the value expected. To improve the total light coupling efficiency $\eta_T$, the distance between the light emitting surface of the light emitting element 14 and the light receiving end face of the optical fiber 26 in the transmission module unit 12, and the distance between the light receiving surface of the PIN-PD 16 and the light emitting surface of the reception optical fiber 27 in the reception module unit 13 are respectively set to the imaging lengths of the convex lenses 61, 62 in the transmission and receiving module units. The result was merely a several % point improvement of the total light coupling efficiency $\eta_T$, which improvement is insufficient, as a general rule.

SUMMARY OF THE INVENTION

Accordingly, an object of the present invention is to provide a duplex or bidirectional optical communication device improved in its total light coupling efficiency.

According to the invention, there is provided a duplex optical communication device having a transmission module unit with a light emitting element and a lens confronting the light emitting surface of said light emitting element, a reception module unit with a light receiving element and a lens confronting the light receiving surface of said light receiving element, a connector receptacle for holding said transmission module unit and said reception module unit, and a connector plug which may be fitted into said connector receptacle and is provided with transmission and reception optical fiber, wherein, the distance from the end face of said transmission optical fiber confronting said light emitting element to said lens in said transmission module unit is substantially equal to the imaging length given as the focal length of said lens in said transmission module unit and the distance between the light emitting surface of said light emitting element and said lens of said transmission module unit; and wherein the distance from the end face of said reception optical fiber confronting said light receiving element to said lens in said reception module unit is substantially equal to or less than the focal length of said lens in said reception module unit.

DETAILED DESCRIPTION OF THE PREFERRED EMBODIMENTS

The inventors carefully studied the structure of a duplex optical communication device such as that of FIG. 5.

(I) Transmission Module Unit

The light coupling efficiency $\eta_E$ of the rays from the light emitting element 14 to the transmission optical fiber 26 is $$\eta_E = (\eta_{EW}) \times (\eta_{WF}) \times (\eta_{NA}) \quad (D),$$

where $\eta_{EW}$ is the light coupling efficiency of the rays of light emitted from the light emitting element 14 when they enter a convex lens 61 with a $r_W$ radius, and is given by the following relationship:

$$\eta_{EW} \propto \frac{1}{l_1^2 \tan^2 \theta_E}, \quad (E)$$

where $l_1$ is the distance between the convex lens 61 and the light emitting element 14, and $\theta_E$ is the radiation angle of the rays from the light emitting element 14. The relationship represented as $l_1 \tan \theta_E > r_W$ must hold true to satisfy the terms of equation (E).

$\eta_{WF}$ is the rate of the rays collected by the convex lens 61 and applied to the core of an $r_F$ radius of the transmission optical fiber 26, and is expressed as:

$$\eta_{WF} \propto \frac{1}{M_E^2}, \quad (F)$$

In the above equation, $M_E$ is a magnification of the lens and $M_E > 1$.

$\eta_{NA}$ is the light coupling efficiency of the rays of light applied to the core of the transmission optical fiber 26, when the rays fall within a maximum light receiving angle $\theta_{Fmax}$ determined by a numeral aperture NA of the optical fiber, and is given by $$\eta_{NA} = \frac{\frac{1}{M_E^2} \int_a^1 (\cos^{-1}\sqrt{y})^2 dy + a(\theta_{Fmax})^2}{\frac{1}{M_E^2} \int_0^1 (\cos^{-1}\sqrt{y})^2 dy}, \quad (G)$$

where $$a = \cos^2 M_E \theta_{max}, \text{ and}$$

Y is a normalized light intensity.

As may be seen from the formulae (D) to (G), in improving the light coupling efficiency $\eta_E$ on the transmission side, the distance $l_1$ between the convex lens 61 and the light emitting element 14 is set as short as possible. Further, the distance $l_3$ between the core end face of the transmission optical fiber 26 and the convex lens 61 is set to the imaging length given by a magnification $M_E$ to provide a maximum of $(\eta_{WF}) \times (\eta_{NA})$. The magnification $M_E$ for providing the $l_3$ does not always take a value to provide strictly the maximum product, but may take a value approximate to such. The thickness of the convex lens 61 is $l_2$.

The distance $l_3$ is mathematically expressed by $$l_3 = (1 - M_E)F - S'_H$$

where F is the focal length of the convex lens 61, $S'_H$ is a distance between the end face of the optical fiber 26 and the principal point of the convex lens 61.

Generally, in a magnification $M_E$ determined to satisfy the conditions described above, in the equation wherein, $l_1 = 0.3$ mm, $l_3 = 1.6$ mm.

(II) Reception Module Unit

The light coupling efficiency $\eta_D$ of the rays from the optical fiber 27 applied to the PIN-PD 16 is given as:

$$\eta_D = (\eta_{FW}) \times (\eta_{WD}) \quad (H),$$

$\eta_{FW}$ is the light coupling efficiency of the rays emitted from the optical fiber 27 at a given radiating angle $\theta_F$, as given by a numeral aperture NA when it enters the convex lens 62, which is given by the following relationship:

$$\eta_{FW} \propto \frac{1}{l_3^2 \tan^2 \theta_F} \quad (I)$$

The above formula holds true under conditions:

$$l_3 \tan \theta_F > R_L$$

wherein $R_L$ is a radius of the lens.

$\eta_{WD}$ is the light coupling efficiency of the rays entering the convex lens 62 when they reach the light receiving surface of the PIN-PD 16, which is given by the relationship:

$$\eta_{WD} \propto \frac{1}{M_D^2}, \quad (J)$$

where $M_D$ is a magnification of the convex lens 62. This relationship (J) holds true when $M_D > r_D$, where $r_D$ is the light rethe distance $l_3$. Physically, this is realized by making the optical fiber 27 approach the convex lens 62. An extreme approach of the optical fiber 27 toward the convex lens 62 expands the flux of rays so that it is wider than the light receiving area of the PIN-PD 16. As a result, the radiating efficiency of the rays to the light receiving surface is deteriorated. The optical fiber 27 comes into contact with the convex lens 62, to possibly damage the convex lens 62. To avoid this, there is an approach to enlarge the light receiving area of the PIN-PD 16, to impove the light receiving efficiency. This approach, however, increase the size of the reception module unit. In this respect, this approach is not only impracticable, but increases stray capacitance of the PIN-PD 16, deteriorating its response characteristic, as well. The increase of the total light coupling efficiency $\eta_T$ is attained by decreasing the magnification $M_D$, as seen from the (J) formula. However, decreasing $M_D$ requires an increase in the distance $l_3$ because $$M_D \propto \frac{l_1 + S_H}{l_3 + S_H}.$$

$S_H$ is a distance between the end face of the convex lens 61 at the LED 33 side and the principal point of the convex lens 61. Further, to form a real image on the light receiving surface of the PIN-PD 16, the $l_3$ must be set at a value larger than the focal length of the lens. The large distance $l_3$, however, decreases the light coupling efficiency $\eta_{FW}$ in the formula (I) and, therefore, this does not lead to an improvement of the light coupling efficiency $\eta_D$.

Calculating the imaging length $l_1$ by using constants of the usual optical fiber in a magnification $M_E$ determined to have the conditions described above, the lens and the light receiving elements, yields the equality, $l_1 = 1.6$ mm. In the transmission side, $l_1 = 0.3$ mm. Thus, the imaging length $l_1$ in the transmission side is different from that in the reception side; $l_1$ in the transmission side $= 0.3$ mm and $l_1$ in the reception side $= 1.6$ mm.

Generally, the core radius $r_F$ of the reception optical fiber 27 is from approximately 0.025 mm to 0.25 mm. The light receiving radius $r_D$ of the PIN-PD 16 is from 0.4 mm to 0.5 mm. The former is larger than the latter; $r_D > r_F$. If the numeral aperture NA of the reception optical fiber 27 is 0.4, the beam radius $r_B$ when the rays of light is emitted from the light emitting surface of the reception optical fiber 27 toward the convex lens 62, is given $$r_B = r_F + l_3 \tan[\sin^{-1}(NA)] = 0.36$$

As may be seen, $r_B < r_D$. Thus, in the reception side, i.e., in the reception module unit 13, if the length $l_3$ is so set as to be equal to the focal length and the rays of light passed through the lens are made substantially parallel, $r_B < r_D$ is also kept on the light receiving surface. This implies that, with the distance $l_3$ set equal to the focal length, if the transmission module unit 12 is so designed as to have substantially the same module structure as that of the transmission module unit 12, a 100% light coupling efficiency $\eta_D$ is attained for the rays from the reception optical fiber 27, which are applied to the PIN-PD 16.

As may be seen from the formulae (D) to (H), in the transmission module unit 12 used in improving the light coupling efficiency, all one has to do is to obtain the $M_E$ and the distance $l_3$ at which the maximum light coupling efficiency $\eta_E$ of the rays from the light emitting element 14 being applied to the transmission optical fiber 26 is attained. On the other hand, in the reception module unit 13, it is sufficient that the distance $l_3$ is set equal to the focal length. In the reception module unit 13, when $l_3 =$ focal length, $r_B < r_D$. Therefore, even if the distance $l_3$ is slightly shorter than the focal length of the convex lens 62, the light coupling efficiency $\eta_D$ is kept at approximately 100% until $r_B = r_D$.

The present invention is based on the technical concept referred to above. One of the practical arrangements of the invention may now be described with reference to FIG. 6. In the figure, like numerals are used in designating like or equivalent portions in FIG. 5.

Figure 6:
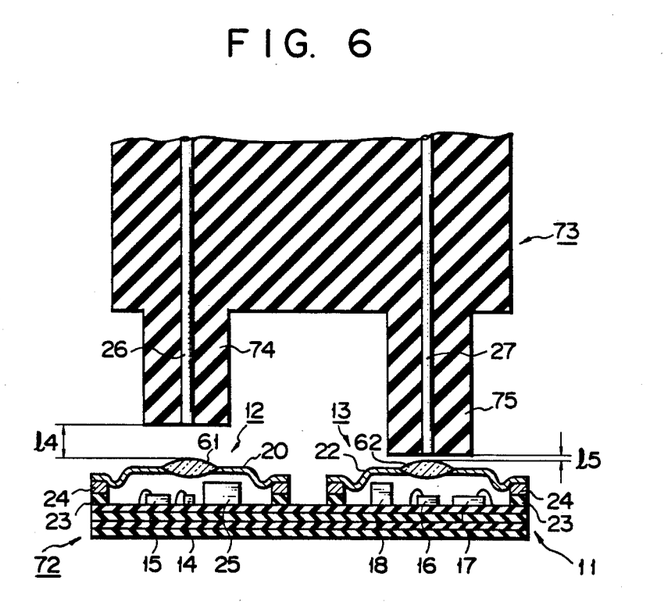
FIG. 6 shows a cross-sectional view of a duplex optical communication device which is an embodiment of the present invention.

In the figure, a transmission module unit 12 and a reception module unit 13 are both provided on a multi-layered interconnection ceramic substrate 11. The transmission module unit 12 contains a light emitting element 14, a driver integrated circuit 15 for driving the light emitting element 14, and a resistive element 25, which are formed on the ceramic substrate 11. The reception module unit 13 is comprised of a PIN-PD (photo diode) 16, a receiver integrated circuit 17 for amplifying the PIN-PD 16, and a by-pass capacitor 18, which are also formed on the ceramic substrate 11. The transmission module unit 12 is further provided with a shell 20 made of Kovar, for example, for covering the light emitting element 14, the driver integrated circuit 15 and the resistive element 25. Similarly, the reception module unit 13 is provided with a shell 22 made of Kovar, for example, for covering the PIN-PD 16, the receiver integrated circuit 17 and the by-pass capacitor 18. A convex lens 61 is provided at the portion of the shell 20 facing the light emitting element 14. Likewise, a transparent window member 21, which serves as a glass plate, for example, is provided at the portion of the shell 22 facing the PIN-PD 16. The shells 20, 22 are seam-welded to a seal ring 24 provided on a ring-like ceramic member 23. With this welding, the transmission module unit 12 and the reception module unit 13 are hermetically sealed. The structure 72 containing the ceramic substrate 11, and the transmission and reception module units 12 and 13, in actuality, is fixedly mounted in the receptacle (not shown). Disposed above the convex lens 61 in the transmission module unit 12 is a transmission optical fiber 26 of which the light receiving end face confronts the light emitting element 14. Similarly, disposed above the transparent window member 21 in the reception module unit 13 is a reception optical fiber 27 of which the light emitting end face faces the PIN-PD 16. The optical fibers 26 and 27 are each provided with a core forming a light transmission path and a cladding surrounding the core for the core protecting purpose.

In the duplex optical communication device with such a structure, the rays of light emitted from the light emitting element 14 in the transmission module unit 12 travel at a fixed radiating angle, pass through the convex lens 61 and come to be incident on the light receiving end face of the transmission optical fiber 26. The light rays transmitted through the reception optical fiber 27 are emitted from the light emitting end face of the reception optical fiber 27 and are received by the PIN-PD 16, through the convex lens 62. In this way, the duplex optical communication of the rays is performed. The optical fibers 26 and 27 are respectively secured to a connector receptacle 73 with ferrules 74 and 75 holding the fibers 26 and 27 in their extending direction. These fibers 26 and 27 extend up to the far ends of the ferrules 74 and 75, respectively. The ferrules 74 and 75 have different lengths. The end of the ferrule 74 facing the lens 61 in the transmission module unit 12 does not reach the end of the ferrule 75 facing the lens 62 in the reception module unit 13. In the present embodiment, the distance $l_4$ between the end face of the convex lens 61 closer to the optical fiber 26 and the core end of the optical fiber 26 is set equal to an imaging length with which the magnification of the emitting surface of the LED 14 becomes the $M_E$ which satisfies the conditions described above. The distance $l_5$ between the end face of the convex lens 62 which is closer to the optical fiber 27 and the core end face of the optical fiber 27 is so set as to be equal to or less than the focal length. The duplex light transmission device thus arranged attains approximately 20% of the total light coupling efficiency $\eta_T$, which valve is three to four times that of the conventional device, e.g., as in the device of FIG. 2.

Figure 7:
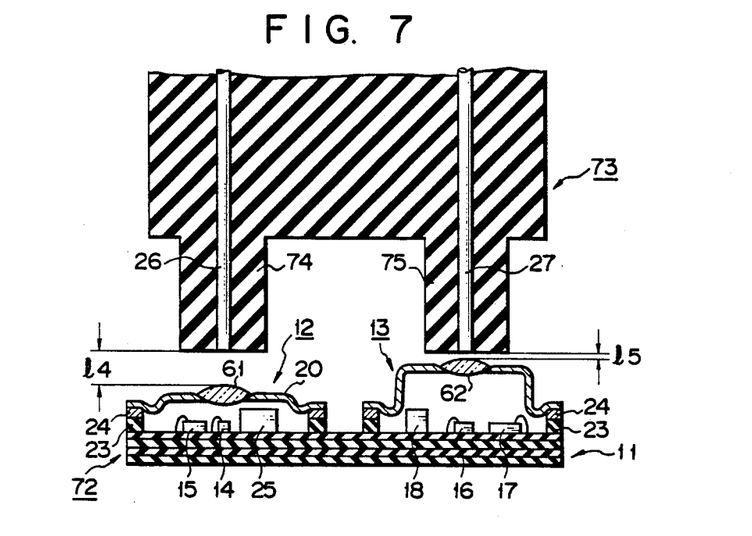
FIGS. 7 through 10 show other embodiments of a duplex optical communication device according to the present invention.

FIG. 7 shows another embodiment of a duplex optical communication device according to the present invention. Both the transmission and reception module units 12 and 13 are formed on the ceramic substrate 11. The lengths of the ferrules 74 and 75 are substantially equal to each other. The position of the convex lens 62 confronting with the PIN-PD 16 is located closer to the end face of the optical fiber 27, so that the distance $l_5$ is equal to the focal length of the convex lens 62. As a matter of course, this embodiment can also attain substantially the same effects as those of FIG. 6.

Figure 8:
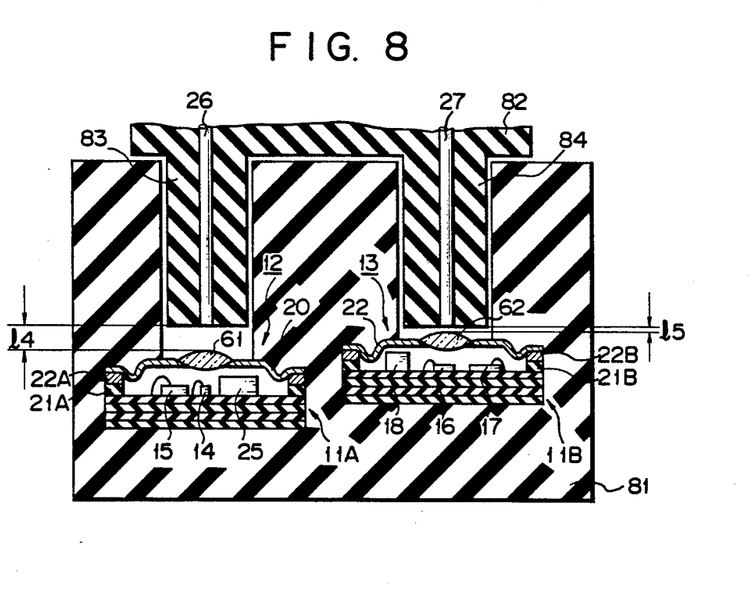

A still further embodiment of the invention may now be described with reference of FIG. 8. In this embodiment, the transmission and reception module units 12 and 13 are formed on ceramic substrates 11A and 11B, respectively. A connector receptacle body 81 is stepped in the height direction or in the extending direction of the ferrule for securing the module units. The distance $l_4$ between the end face of the convex lens 61 which is closer to the optical fiber 26 and the core end of the optical fiber 27 is used as an imaging length. The distance $l_5$ between the end face of the convex lens 62 which is closer to the optical fiber 27 and the core end face of the optical fiber 27 is so set as to be equal to or less than the focal length. It is for this reason that the connector receptacle 81 is stepped where the transmission and reception module units 12 and 13 are fixed the connector receptacle 81. The total light coupling efficiency $\eta_T$ attained by this embodiment is approximately 20% as by the FIGS. 6 and 7 embodiments. The present embodiment employs two ceramic rings 21A and 22A and two seal rings 21A and 22B.

Figure 9:
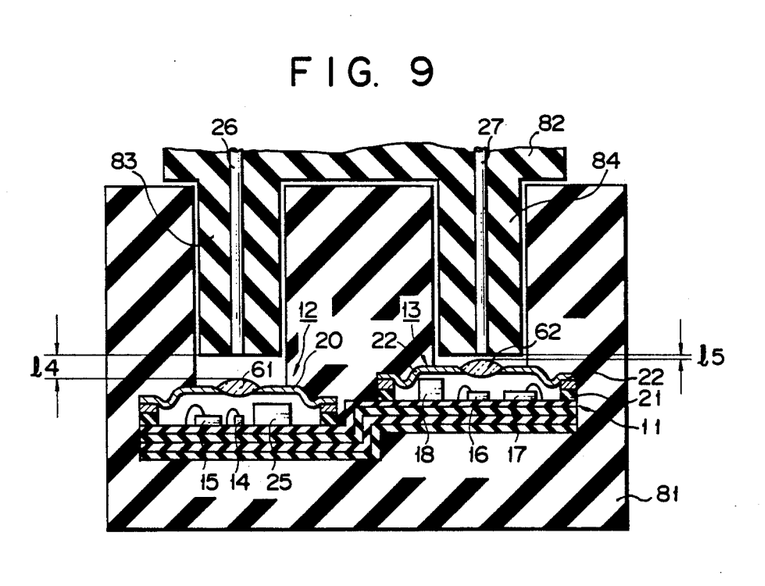

Alternately, the transmission and reception module units 12 and 13 may be formed on the same substrate 11, which is stepped as shown in FIG. 9.

Figure 10:
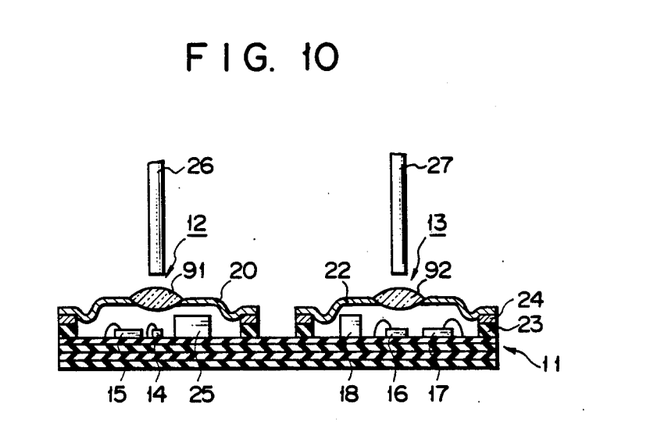

In FIG. 10, which illustrates a further embodiment of the invention, the transmission and reception module units 12 and 13 are both formed on the same substrate 11. The light emitting element 14 and the PIN-PD 16 are formed at the same level on the ceramic substrate 11. The optical fibers 26 and 27 terminates at the same position in the extending direction. Convex lens 91 and 92 with different focal lengths are used. In the transmission module unit 12, the imaging length of the convex lens 91, with which the magnification is the $M_E$ which satisfies the conditions described above, is equal to the focal length of the convex lens 92 in the reception module unit 13. In the above-mentioned embodiments, the distance between the light receiving end face of the transmission module device 6 and the lens in the transmission module unit 12 is equal to the imaging length, in magnification $M_E$, given as the focal length of the lens of the transmission side and the distance between the light receiving surface of the light emitting element 14. Further, the distance between the light emitting surface of the fiber 27 and the lens in the reception module unit 13 is equal to or less than the focal length of the lens on the reception side. It is evident that the equality between those distances is not strict, which is within the spirit of the invention.

Further, the present invention is applicable to a multi-channel light transmission system, while the above-mentioned embodiments are all directed to the two-channel system.

What is claimed is:

1. A duplex optical communication device comprising:
    a transmission module unit having a light emitting element and a lens confronting a light emitting surface of said light emitting element;
    a reception module unit having a light receiving element and a lens confronting a light receiving surface of said light receiving element;
    connector means for holding said transmission module and reception module unit; and
    a connector structure arranged so as to be fitted into said connector means and provided with transmission and reception optical fibers,
    an end face of said transmission optical fiber confronting said light emitting element and being positioned a first finite distance from said transmission module unit lens at an imaging point thereof, and on which is formed an image the magnification of which is set to provide substantially the maximum possible light-coupling efficiency to the transmission module unit, and said transmission module unit lens is between said light emitting element and said transmission optical fiber and
    an end face of the reception optical fiber confronting said light receiving element and being positioned a second finite distance from said reception module unit lens by a distance substantially equal to or less than the focal length of said reception module unit lens, said reception module unit lens being located between said light receiving element and said reception optical fiber, and wherein said first finite distance is longer than said second finite distance.

2. A duplex optical communication device according to claim 1 wherein said distance between said end face of said transmission optical fiber and said transmission module unit lens is equal to the imaging length given as the magnification of said lens, providing a maximum or nearly maximum value of the product $\eta_{WF} \times \eta_{NA}$, where $\eta_{WF}$ is the ratio of the rays collected by said lens in said transmission module unit and the rays actually applied to the core of said transmission optical fiber, and $\eta_{NA}$ is the ratio of the rays applied to said core and the rays falling within a maximum light receiving angle, as given by numeral aperture of said transmission optical fiber.

3. A duplex optical communication device according to claim 1 wherein said imaging length, as given by said focal length of said lens in said transmission module unit lens and said distance between the light emitting surface of said light emitting element and said transmission module unit, is substantially equal to the focal length of said lens in said reception module unit lens.

4. A duplex optical communication device according to claim 1, in which said transmission and reception module units are formed on the same substrate.

5. A duplex optical communication device according to claim 4, in which said lens in said reception module unit is disposed further from said planar substrate than said lens in said transmission module unit.

6. A duplex optical communication device according to claim 4, in which said common substrate has stepped portions, said transmission module unit being disposed at the stepped portion further from said connector plug, while said reception module unit is disposed at the stepped portion closer to said connector plug.

7. A duplex optical communication device according to claim 4, in which said common substrate is a planar substrate.

8. A duplex optical communication device according to claim 7, in which said lens in said transmission module unit and said lens in said reception module unit are formed at the same level on said planar substrate.

9. A duplex optical communication device according to claim 1, in which said transmission and reception module units are formed on different substrates.

10. A duplex optical communication device according to claim 9, in which, in said connector receptacle, a first substrate with said reception module unit formed thereon is disposed closer to said connector plug than a second substrate with said transmission module unit formed thereon.

* * * * *